United States Patent
Mizutani et al.

(10) Patent No.: US 7,048,797 B2
(45) Date of Patent: May 23, 2006

(54) LIQUID-PHASE GROWTH PROCESS AND LIQUID-PHASE GROWTH APPARATUS

(75) Inventors: Masaki Mizutani, Nara (JP); Takehiko Yoshino, Nara (JP); Shoji Nishida, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 10/665,075

(22) Filed: Sep. 22, 2003

(65) Prior Publication Data

US 2004/0118336 A1 Jun. 24, 2004

(30) Foreign Application Priority Data

Sep. 19, 2002 (JP) ........................................ 2002-272739

(51) Int. Cl.
*C30B 19/06* (2006.01)

(52) U.S. Cl. .............................. 117/54; 117/56; 117/57; 117/59; 117/60; 117/61; 117/63; 118/405

(58) Field of Classification Search ................. 118/405; 117/54, 56, 57, 59, 60, 61, 63
See application file for complete search history.

(56) References Cited

FOREIGN PATENT DOCUMENTS

| JP | 55-111970 | | 8/1980 |
|----|-----------|---|--------|
| JP | 57-76822  |   | 5/1982 |
| JP | 57-200300 | * | 12/1982 |
| JP | 60-150622 | * | 8/1985 |
| JP | 1-246193  | * | 10/1989 |
| JP | 2-308521  | * | 12/1990 |
| JP | 3-28188   | * | 2/1991 |
| JP | 4-148532  | * | 5/1992 |

* cited by examiner

*Primary Examiner*—Robert Kunemund
(74) *Attorney, Agent, or Firm*—Fitzpatrick, Cella, Harper & Scinto (57) ABSTRACT

A liquid-phase growth process for continuously growing a crystal film on a plurality of substrates with respect to their one side surfaces, characterized in that said plurality of substrates are kept afloat on the surface of a flowing solution for liquid-phase epitaxy which comprises a crystallizing material dissolved in a solvent in a supersaturated state and which is flowing in a solution flow passage, and while said plurality of substrates being moved by virtue of said flowing solution in said solution flow passage, a crystal film is grown on the surfaces of said plurality of substrates which are in contact with said flowing solution. A liquid-phase growth apparatus suitable for practicing said liquid-phase growth process.

14 Claims, 3 Drawing Sheets

LIQUID-PHASE GROWTH PROCESS AND LIQUID-PHASE GROWTH APPARATUS

BACKGROUND OF THE INVENTION

1. Field of the Invention

The present invention relates to a liquid-phase growth process and a liquid-phase growth apparatus for growing a crystal. More particularly, the present invention relates to a liquid-phase growth process and a liquid-phase growth apparatus for continuously growing a crystal film on a plurality of substrates from a solution comprising a crystallizing material dissolved in a solvent comprising a metal or the like in a supersaturated state.

2. Related Background Art

There is known a liquid-phase growth process by way of so-called dipping for forming a crystal thin film on a substrate, where said crystal thin film is formed on both surfaces of said substrate. In general, only the crystal thin film formed on one surface of the substrate is subjected to practical use and because of this, the crystal thin film formed on the other surface of the substrate is wasted.

In order to eliminate this disadvantage, there have been made various proposals which enable formation of a crystal thin film only on one surface of a substrate.

For instance, Japanese Laid-open Utility Model Publication No. 55(1980)-111970 (hereinafter referred to as "Document 1") discloses a method for growing a crystal film on the front face of a wafer as a substrate by dipping said wafer in a high temperature growth melt, wherein said wafer is dipped in the melt while being held on a wafer holder provided with a platinum plate which contacts substantially over the entire back face of said wafer on which no crystal film is grown. It is understood that the platinum plate in this case serves to prevent the back face of the wafer from being contacted with the melt so that only the front face of the wafer on which the crystal film is grown is contacted with the melt.

Japanese Laid-open Patent Publication No. 57(1982)-76822 (hereinafter referred to as "Document 2") discloses a liquid-phase epitaxial growth process wherein a substrate holder having four arms arranged at an equal interval and which is held by a retaining bar capable of being moved in either an upward direction or a downward direction is used, where a substrate is arranged in the substrate holder such that it is maintained by said arms of said substrate holder so as be movable in either an upward direction or a downward direction, said retaining bar is moved downward to get said arms having said substrate maintained thereon in a melt so that said substrate is kept afloat on the surface of the melt, whereby a crystal thin film is grown only on the face of said substrate which is contacted with the melt.

However, any of the techniques disclosed in Documents 1 and 2 still has disadvantages which are necessary to be overcome.

Particularly, the technique disclosed in Document 1 has shortcomings such that it takes a time to accurately arrange the substrate (the wafer) in the apparatus (the jig), it is difficult to make such that the melt is completely prevented from being invaded between the substrate and the platinum plate for preventing the crystal growth on the back face of the substrate, and this situation makes it difficult to obtain a product at a high yield and at a reasonable production cost. Besides, the technique disclosed in Document 1 has other disadvantages such that in order to continuously grow a crystal film on a plurality of substrates, the apparatus used is necessary to be designed to be suitable to do so, where the structure of the apparatus becomes to be unavoidably complicated, and there are such shortcomings as above described also in this case.

The technique disclosed in Document 2 has an advantage in that the back face of the substrate is effectively prevented from having the growth of the crystal film thereon. However, the technique disclosed in Document 2 has disadvantages such that when it is intended to load a plurality of substrates in the apparatus at the same time, the apparatus is necessary to be designed to be suitable to do so, where the structure of the apparatus becomes to be unavoidably complicated, and in this case, it takes a certain period of time in order to accurately arrange the plurality of substrates in the apparatus, and this situation makes it difficult to attain satisfactory productivity.

SUMMARY OF THE INVENTION

The present invention has been accomplished as a result of extensive studies by the present inventors in order to solve the foregoing problems in the prior art.

An object of the present invention is to provide a liquid-phase growth process which enables continuous growth of a high quality crystal film on a plurality of substrates while effectively preventing crystal growth on their back faces, at an improved productivity.

Another object of the present invention is to provide a liquid-phase growth apparatus suitable for practicing said liquid-phase growth process.

A typical embodiment of the liquid-phase growth process of the present invention is characterized in that a plurality of substrates are kept afloat on the surface of a flowing solution for liquid-phase epitaxy which comprises a crystallizing material dissolved in a solvent comprising a metal or the like in a supersaturated state and which is flowing in a solution flow passage, and while said plurality of substrates being moved by virtue of said flowing solution, a crystal film is grown on the surfaces of said plurality of substrates which are in contact with said flowing solution.

In the liquid-phase growth process of the present invention, it is preferred to make the process such that the plurality of substrates are arranged along the solution flow passage of the flowing solution without being overlapped with each other. Of the substrates thus arranged, one or more of them which are positioned in the downstream region of the solution flow passage are recovered, and the remaining substrates positioned upstream of the recovered substrates are moved toward a downstream direction by virtue of the flowing solution.

The liquid-phase growth process of the present invention is preferred to include a step wherein the plurality of substrates are moved by virtue of the flowing solution and a step wherein the plurality of substrates are stopped such that they stay on the surface of the flowing solution while being kept afloat thereon.

In the liquid-phase growth process of the present invention, the flowing solution is preferred to flow at a velocity which is faster than the average speed for the plurality of substrates to be moved.

In the liquid-phase growth process of the present invention, it is preferred to make the process such that the flowing solution has a temperature gradient along the solution flow passage of the flowing solution.

In the liquid-phase growth process of the present invention, it is preferred to make the process such that the flowing solution is recovered at an end portion of the solution flow passage and a crystallizing material is dissolved in the recovered solution, and the recovered solution is recycled into the solution flow passage of the flowing solution.

A typical embodiment of the liquid-phase growth apparatus of the present invention comprises a solution supply crucible for supplying a solution for liquid-phase epitaxy, a solution flow passage for allowing said solution supplied from said solution supply crucible to flow therein, and a solution recovery crucible for recovering said solution from said solution flow passage. Said solution supply crucible is communicated with said solution flow passage and said solution recovery crucible is communicated with said solution flow passage. Said solution flow passage has substrate supply means provided in the vicinity of said solution supply crucible and substrate recovery means provided in the vicinity of said solution recovery crucible. Said plurality of substrates are consecutively supplied in said solution flow passage by said substrate supply means, followed by being moved in said solution flow passage by virtue of said flowing solution in said solution flow passage while said plurality of substrates are kept afloat on the surface of said flowing solution, whereby a crystal film is grown on the surfaces of said plurality of substrates which are in contact with said flowing solution, and said plurality of substrates having said crystal film grown thereon are consecutively recovered by said substrate recovery means.

DETAILED DESCRIPTION OF THE INVENTION AND PREFERRED EMBODIMENTS

In the following, preferred embodiments of the present invention will be detailed with reference to the drawings. It should be understood that the present invention is not restricted by these embodiments.

Figure 1A:
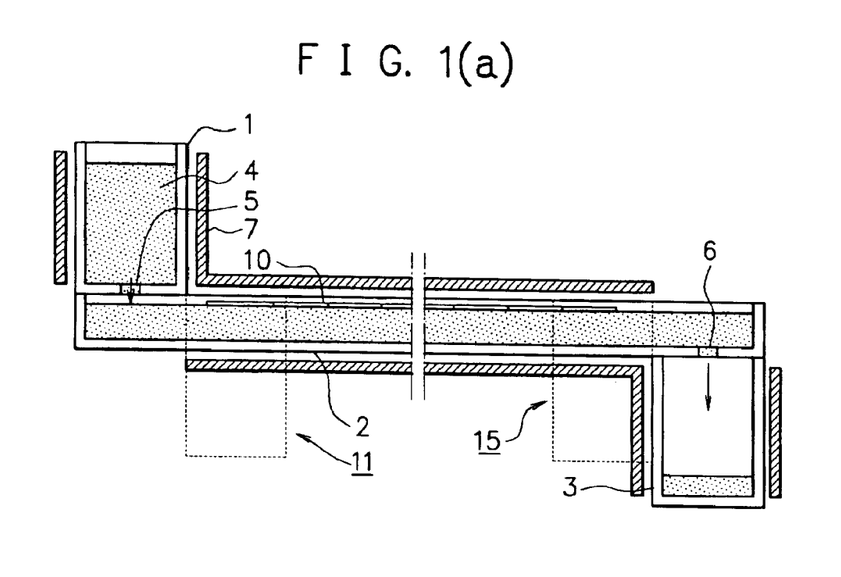
FIG. 1(a) is a schematic cross-sectional view illustrating an example of a liquid-phase growth apparatus which is suitable for practicing the liquid-phase growth process of the present invention.

FIG. 1(a) is a schematic cross-sectional view illustrating an example of a liquid-phase growth apparatus which is suitable for practicing the liquid-phase growth process of the present invention. And FIG. 1(b) is a schematic top view of the liquid-phase growth apparatus shown in FIG. 1(a), which illustrates the constitution of said liquid-phase growth apparatus.

Figure 1B:
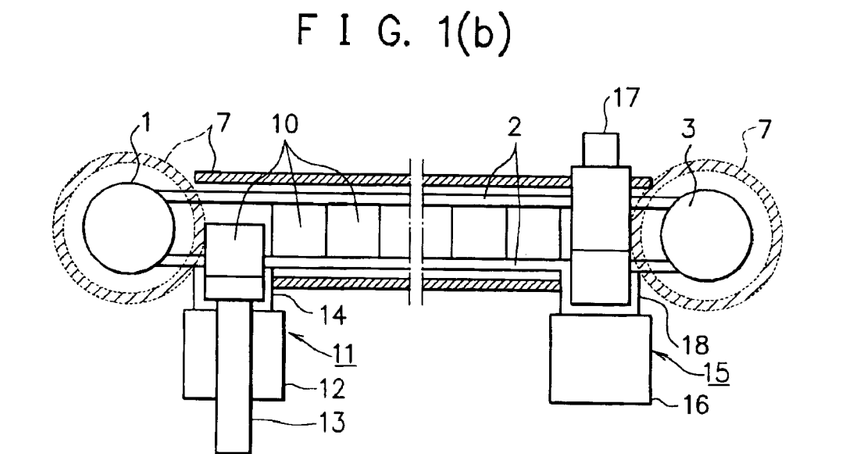
FIG. 1(b) is a schematic top view of the liquid-phase growth apparatus shown in FIG. 1(a), which illustrates the constitution of said liquid-phase growth apparatus.

The liquid-phase growth apparatus shown in FIGS. 1(a) and 1(b) is provided with a solution supply crucible 1 for supplying a solution (a melt) for liquid-phase epitaxy, a solution flow passage 2 for allowing said solution supplied from the solution supply crucible 1 to flow therein, and a solution recovery crucible 3 for recovering the solution (the melt) from the solution flow passage 2.

Reference numeral 4 indicates a solution (a melt) obtained by dissolving a crystallizing material in a solvent comprising a metal (this solvent will be hereinafter referred to as "metal solvent") in a supersaturated state which is introduced into and maintained in the solution supply crucible 1. The solution supply crucible 1 is provided with an effluent hole 5 at a bottom portion thereof. The solution supply crucible 1 is communicated with the solution flow passage 2 through the effluent hole 5.

The effluent hole 5 is provided with a switching valve (not shown) capable of opening or closing the effluent hole 5. By regulating the switching valve provided at the effluent hole 5, it is possible to control the flow rate of the solution 4 (the melt) which is fluxed from the solution supply crucible 1 into the solution flow passage 2.

The solution flow passage 2 is designed such that it has a grade which is gently sloped in a direction from the side of the solution supply crucible 1 toward the side of the solution recovery crucible 3 so as to allow the solution 4 (the melt) to flow in the solution flow passage 2 at a desired flow speed.

The solution 4 (the melt) contained in the solution supply crucible 1 flows into the solution flow passage 2 through the effluent hole 5 of the solution supply crucible 1, while the flow rate of the solution 4 fluxed from the solution supply crucible 1 is controlled by regulating the switching valve provided at the effluent hole 5. The solution 4 flowing in the solution flow passage 2 in this way is allowed to naturally flow in the solution flow passage 2 toward the solution recovery crucible 3.

The solution flow passage 2 is provided with a discharge hole 6 at an end portion thereof, through which the solution 4 (the melt) from the solution flow passage 2 is discharged into and recovered by the solution recovery crucible 3. The solution 4 (the melt) recovered in this way may be recycled to the solution supply crucible 1 after a crystallizing material is newly dissolved therein in a supersaturated state.

The flow rate of the solution 4 (the melt) should be decided in consideration for the crystallizing material in the solution not to be depleted in the downstream side of the solution flow passage 2. Incidentally, the flow rate of the solution 4 (the melt) may be decided in accordance with the size of the effluent hole 5, that of the discharge hole 6, and the cross section form and the gradient of the solution flow passage 2.

Figure 2:
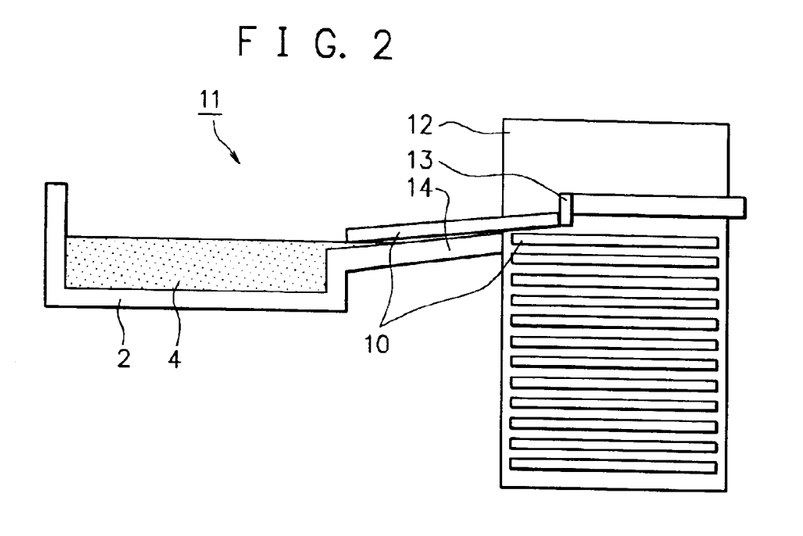
FIG. 2 is a schematic cross-sectional view illustrating the constitution of an example of the substrate supply equipment in the liquid-phase growth apparatus shown in FIGS. 1(a) and 1(b).

The solution supply crucible 1, the solution flow passage 2, and the solution recovery crucible 3 are surrounded by a heater 7 so that the solution 4 (the melt) can be controlled to have a desired temperature at respective portions A substrate supply equipment 11 for supplying a substrate 10 is provided at an upstream portion of the solution flow passage 2. FIG. 2 is a schematic cross-sectional view illustrating the constitution of an example of the substrate supply equipment 11 in the liquid-phase growth apparatus shown in FIGS. 1(a) and 1(b).

The substrate supply equipment 11 shown in FIG. 2 has a substrate cassette 12, an extrusion member 13 and a slant portion 14. Particularly, as shown in FIG. 2, the solution 4 (the melt) is replete with the solution flow passage 2 so as to reach about the middle of the slant portion 14 so that a substrate 10 delivered from the substrate cassette 12 can be smoothly moved toward the solution flow passage 2.

In the substrate cassette 12, a plurality of substrates 10 are dividedly loaded in multiple stages so that they can be sequentially taken out for every stage. The plurality of substrates 10 loaded in the substrate cassette 12 are extruded one by one to enter in the solution flow passage 2 by means of the extrusion member 13. When one substrate 10 is delivered from the substrate cassette 12 in this way, the substrate cassette 12 is lifted to an extent corresponding to one stage where the next substrate is situated. By this, the preparation to deliver the next substrate is made ready.

In the present invention, the substrate 10 is preferred to comprise a substrate having a density which is less than that of the solution 4 (the melt). This makes it possible for the substrate 10 to reach the downstream side of the solution flow passage 2 following the flow of the solution 4 (the melt) while being kept afloat on the surface of the solution 4. At every time when the substrate is moved to reach the downstream side of the solution flow passage 2, other substrates accommodated in the substrate cassette 12 are sequentially supplied in the solution flow passage 2.

When the substrate 10 is arranged on the solution 4 (the melt) containing the crystallizing material in a supersaturated state and which is flowing in the solution flow passage 2 such that it is kept afloat on the surface of the solution 4, the surface of the substrate 10, which is in contact with the solution 4, is contacted with the solution 4, whereby a crystal film is epitaxially grown on said substrate surface which is contacted with the solution 4.

As above described, according to the liquid-phase growth process of the present invention, a crystal film can be effectively grown only on one surface of a given substrate on a desired side thereof solely by virtue of the flow of a solution (a melt) comprising a crystallizing material dissolved in a metal solvent in a supersaturated state. To be more specific, a plurality of substrates can be moved as required solely by virtue of the flow of said solution without using any particular jig or transportation mechanism, where a crystal film can be continuously grown on said plurality of substrates with respect to only one side of their surfaces. This enables efficiently mass-produced products having a crystal film.

Now, in the solution flow passage 2 in which the solution 4 (the melt) flows from the upstream side toward the downstream side, the temperature of the solution 4 is preferred to be controlled by means of the heater 7 such that it is gradually lowered as the solution approaches the downstream side of the solution flow passage 2, so that a crystal film can be epitaxially grown on the substrate 10 at a desired growth speed even at a position in the downstream side of the solution flow passage 2.

Separately, in order to prevent the crystallizing material contained in the solution 4 from being depleted in the downstream region of the solution flow passage 2, it is possible to adopt a manner in that the cross section form of the solution flow passage 2 is varied so that the sectional area of the solution 4 becomes gradually smaller as the solution 4 approaches the downstream region of the solution flow passage 2. In this case, the cross section form of the solution flow passage 2 is varied, for instance, such that the width of the solution flow passage 2 is relatively widened in the upstream region and the width thereof is relatively narrowed in the downstream region.

As previously described, in the solution flow passage 2, a plurality of substrates 10 are continuously supplied and they are moved toward the downstream side by virtue of the solution 4 (the melt) which flows in the solution flow passage 2, where the plurality of substrates 10 are intermittently supplied at a prescribed time interval so that they are not mutually overlapped. In order to prevent the plurality of substrates 10 from being mutually overlapped in this case, it is possible to arrange a separation member (not shown) between each adjacent substrates.

The plurality of substrates 10 supplied in the solution flow passage 2 in the above-described way may be moved in a state that each adjacent substrate (including a case where said separation member is provided between them) is mutually contacted.

As the above-described separation member, it is possible to use a member shaped in a pillar form or a plate form which has a greater thickness than that of the substrate 10 and which is made of a material which is not deteriorated even when contacted with the solution 4 (the melt) over a long period of time and has a specific gravity which is lighter than that of the solution 4. Such material can include a quartz and a graphite carbon.

Figure 3:
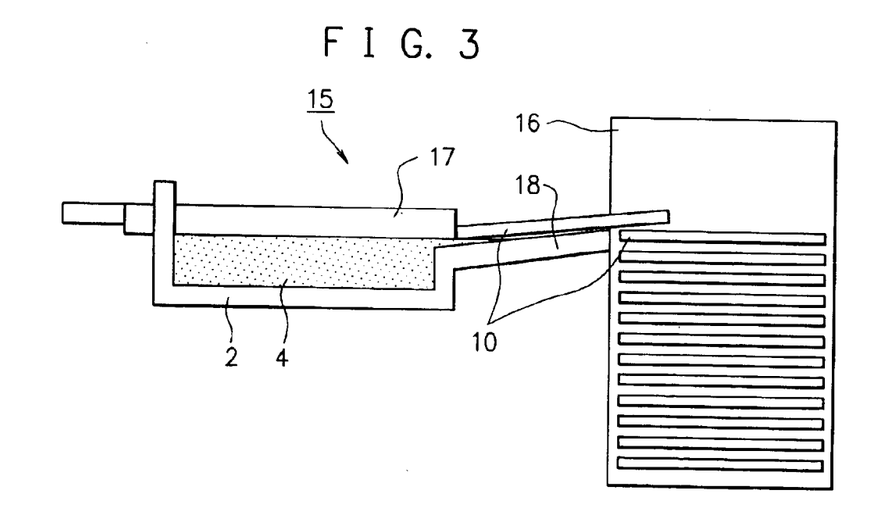
FIG. 3 is a schematic cross-sectional view illustrating the constitution of an example of the substrate recovery equipment in the liquid-phase growth apparatus shown in FIGS. 1(a) and 1(b).

As shown in FIGS. 1(a) and 1(b), a substrate recovery equipment 15 for recovering the substrate 10 from the solution flow passage 2 is provided at an end portion of the downstream region of the solution flow passage 2. FIG. 3 is a schematic cross-sectional view illustrating the constitution of an example of the substrate recovery equipment 15 in the liquid-phase growth apparatus shown in FIGS. 1(a) and 1(b).

The substrate recovery equipment 15 shown in FIG. 3 has a substrate cassette 16, a recovery member 17 and a slant portion 18.

Now, as shown in FIG. 3, the substrates 10, which are successively carried from the upstream side of the solution flow passage 2 following the flow of the solution 4 (the melt) while a crystal film being epitaxially grown thereon, are suspended in a terminal region of the solution flow passage 2 for a prescribed period of time. Thereafter, they are extruded one by one onto the slant portion 18 by means of the recovery member 17, followed by being further extruded to enter in the substrate cassette 16 by means of the recovery member 17. The substrates 10 which are successively entered in the substrate cassette 16 in this way are sequentially accommodated in the substrate cassette 16.

At this time, during the time when the substrates 10 are extruded into the substrate cassette 16 by means of the recovery member 17, other substrates 10 situated in the upstream region of the solution flow passage 2 are being restricted with respect to their movement by means of a side portion of the recovery member 17. When the accommodation of the former substrates 10 in the substrate cassette 16 is terminated, the recovery member 17 is retreated to allow the latter substrates 10 situated in the upstream region of the solution flow passage 2 to be moved in the downstream region of the solution flow passage 2.

Now, when one substrate 10 is accommodated in the substrate cassette 16 as above described, the substrate cassette 16 is descended to get ready to receive the next substrate 10 to be accommodated therein. Particularly, at every time when the latter substrates 10 are moved in the downstream region of the solution flow passage 2, the former substrates 10 which are previously situated therein are sequentially recovered in the substrate cassette 16 in the way as above described.

Incidentally, by making the flow velocity of the solution 4 (the melt) which is flowing in the solution flow passage 2 to be faster than the average speed for the substrates 10 to be moved in the solution flow passage following the flow of the solution, the solution which contacts with the surfaces of the substrates is changed one after another, whereby the solution can be prevented from lacking in the crystallizing material contained therein.

In this case, for instance, it is possible to adopt a manner of repeating an operation wherein the movement of the substrates 10 situated in the terminal region of the downstream region of the solution flow passage 2 is controlled so as to stop the substrates from moving for a prescribed period of time where other substrates 10 which are situated in the upstream region of the solution flow passage 2 are also stopped from moving, thereafter the former substrates are recovered, and following this, the aforesaid other substrates concurrently are moved toward the downstream region. According to this method, during the stopping time of the substrates, the steady flow of the solution 4 (the melt) is contacted with the faces of the substrates which are in contact with the solution. This contributes to uniforming the crystal films grown on said substrate faces.

In the case where the solution recovery crucible 3 is filled with the recovered solution 4 (the melt), the solution recovery crucible 3 is promptly replaced by an empty recovery crucible. At this time, the solution recovery crucible 3 having the used solution (the used melt) contained therein is heated to a prescribed temperature, where a crystallizing material is dissolved in the used solution in a supersaturated state to prepare a solution (a melt) as the solution 4 (the melt) in the crucible. The solution supply crucible 1 which has been emptied is replaced by this crucible having aforesaid solution therein.

Separately, it is possible that the retaining temperature of the solution recovery crucible 3 is made to be the same as the dissolution temperature of the crystallizing material to be dissolved in the used solution (the used melt) and the recovery of the used solution and the dissolution of the crystallizing material are concurrently performed.

The supply of the aforesaid crystallizing material into the used solution (the used melt) may be performed by a manner wherein a crystallizing material shaped in a plate form or a wafer form is immersed in the solution while being retained on a carrier, a manner wherein a powdery crystallizing material is introduced into the used solution or a manner wherein a gaseous material as the crystallizing material is subjected to bubbling in the used solution through a conduit.

Figure 4:
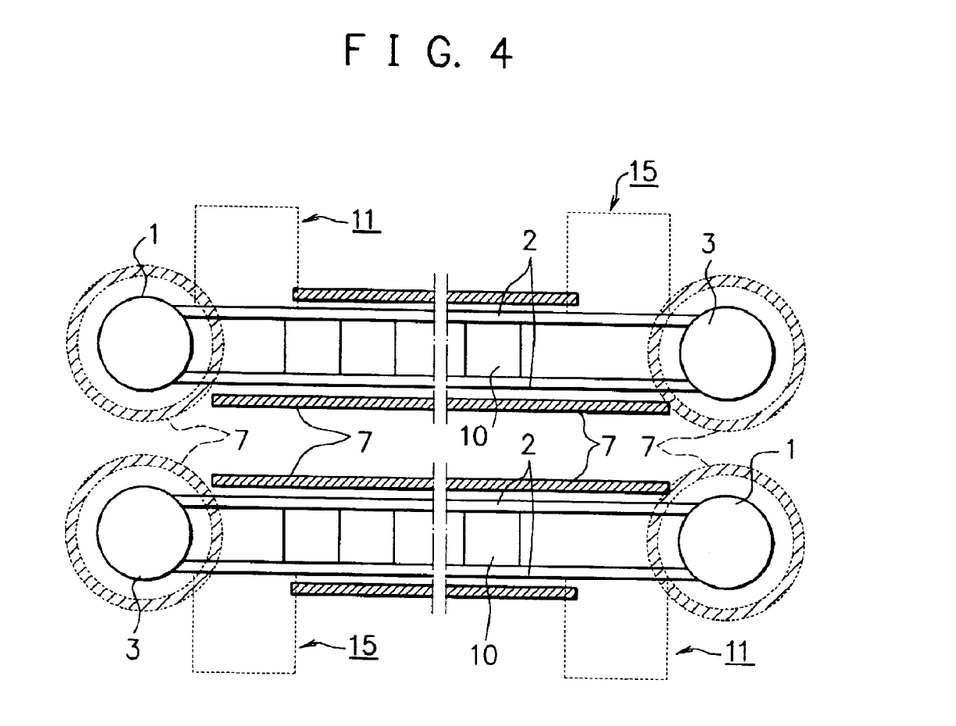
FIG. 4 is a schematic top view illustrating another example of a liquid-phase growth apparatus which is suitable for practicing the liquid-phase growth process of the present invention, which illustrates the constitution of said liquid-phase growth apparatus.

In the present invention, the liquid-phase growth apparatus may be constituted by combining a plurality of solution flow passages having such a constitution as shown in FIGS. 1(a) and 1(b). FIG. 4 is a schematic top view illustrating an embodiment of such a liquid-phase growth apparatus in which two solution flow passages 2 having such a constitution as shown in FIGS. 1(a) and 1(b) are combined, except that said two solution flow passages are made different one from the other in terms of the flow direction of the solution 4 (the melt).

In the liquid-phase growth apparatus shown in FIG. 4, the two solution flow passages are arranged such that the solution supply crucible 1 and the solution recovery crucible 3 in one solution flow passage are respectively adjacent to the solution recovery crucible 3 and the solution supply crucible 1 in the other solution flow passage. Because of this, the exchange of the solution supply crucible with the solution recovery crucible can be more smoothly performed.

In any case, it is preferred that the solution supply crucible 1, the solution flow passage 2, the solution recovery crucible 3, the substrate supply equipment 11, and the substrate recovery equipment 15 are constituted by a quartz, a graphite carbon, a metal whose melting point is high such as Pt or the like, or ceramics.

As the substrate 10, commercially available single crystal substrates and multicrystalline substrates which are made of silicon, gallium arsenide or the like can be optionally used. There is no particular limitation for the form of the substrate. However, it is preferred that the substrate is shaped in a square form or a rectangular form.

Now, in the case where a magnetic garnet crystal film which is used in a magnetic optical element is formed by way of liquid-phase epitaxial growth, as the solution 4 (the melt), there is used, for instance, a solution obtained by dissolving a garnet raw material as the crystallizing material in a solvent comprising PbO and $B_2O_3$.

In the case where a lithium niobate crystal film which is used in a non-linear optical element is formed by way of liquid-phase epitaxial growth, as the solution 4 (the melt), there is used, for instance, a solution obtained by fusing $Li_2O$, $Nb_2O_5$, and $V_2O_5$.

In the case where a GaAs crystal film as a III–V group compound semiconductor which is used in an oscillation element or a light emitting element is formed by way of liquid-phase epitaxial growth, as the solution 4 (the melt), there is used, for instance, a solution obtained by dissolving a GaAs multicrystalline material and a dopant such as Si in a solvent comprising Ga.

In the case where a silicon crystal film which is used in a semiconductor integrated circuit or a solar cell element is formed by way of liquid-phase epitaxial growth, as the solution 4 (the melt), there is used, for instance, a solution obtained by dissolving Si and a dopant such as Ga, B, Al, P or As in a solvent comprising Sn, In, Al, or Cu.

In the following, the present invention will be described in more detail by illustrating an example. It should be understood that this example is only for the illustrative purpose and the scope of the present invention is not restricted by the example.

EXAMPLE

This example describes a preferred embodiment of the liquid-phase growth process in the case of forming a silicon single crystal film by the liquid-phase growth process of the present invention, using the apparatus shown in FIGS. 1(a) and 1(b) and FIGS. 2 and 3.

As the substrate 10, a plurality of Si-single crystal wafers having a size of 125 mm×125 mm.

As the solution 4 (the melt), a supersaturated solution of silicon (Si) obtained by dissolving silicon (Si) in 28 liters of a metal solvent consisting of indium (In) at 930° C. in a supersaturated state is used.

The solution supply crucible 1 comprises a crucible made of quartz which is shaped in a cylindrical form and has an inner diameter of 30 cm and a depth of 40 cm. Similarly, the solution recovery crucible 3 comprises a crucible made of quartz which is shaped in a cylindrical form and has an inner diameter of 30 cm and a depth of 40 cm.

The solution supply crucible 1 contains aforesaid Si-supersaturated solution as the solution 4 therein and the solution 4 contained in the solution supply crucible 1 is maintained at 920° C. by regulating the heater 7.

The solution supply crucible 1 has an effluent hole 5 capable of being opened and closed at the bottom thereof.

The solution supply crucible 1 is communicated with the solution flow passage 2 through the effluent hole 5 such that the solution 4 contained in the solution supply crucible 1 flows in the solution flow passage 2 through the effluent hole 5.

The effluent hole 5 of the solution supply crucible 1 is provided with a switching valve (not shown) capable of opening or closing the effluent hole 5. By regulating the switching valve provided at the effluent hole 5, it is possible to control the flow rate of the solution 4 (the melt) which is fluxed from the solution supply crucible 1 into the solution flow passage 2. In this example, it is made such that the solution 4 contained in the solution supply crucible 1 flows in the solution flow passage 2 at a flow rate of 2.8 liters per minute.

The solution flow passage 2 is formed of a graphite carbon such that the cross section thereof has a depth of 1 cm and a width of 13 cm and the total length thereof is 29 m. And the solution flow passage 2 is designed such that it has a grade which is gently sloped in a direction from the side of the solution supply crucible 1 toward the side of the solution recovery crucible 3 so as to allow the solution 4 to flow in the solution flow passage 2 at a flow speed of 21.3 cm per minute.

The aforesaid plurality of Si-single crystal wafers as the substrates 10 are accommodated in the substrate supply equipment 11, and they are intermittently extruded at a time interval of 5.2 seconds in the solution flow passage 2 from the substrate supply equipment 11.

The substrate recovery equipment 15 arranged in the downstream side of the solution flow passage 2 intermittently recovers the substrates 10 which are carried following the flow of the solution 4 in the solution flow passage 2 at a time interval of 5.2 seconds.

In this example, in the solution flow passage 2, 230 substrates 10 are kept afloat on the surface of the flowing solution 4 while being contacted with each other through their side faces. Of these substrates being kept afloat on the surface of the flowing solution in this way, when the terminal one is recovered by the substrate recovery equipment 15, along with this, the remaining substrates present in the upstream side of the solution flow passage 2 are concurrently moved toward the area where said terminal substrate has been present. When the terminal substrate in the downstream region of the solution flow passage 2 reaches the substrate recovery equipment 15, said terminal substrate is stopped there and, along with this, the succeeding substrates are stopped from moving. This operation is repeated, where each of the plurality of substrates travels in the solution flow passage 2 for 20 minutes at an average speed of 14.4 cm per minute.

The temperature of the flowing solution 4 in the solution flow passage 2 is controlled such that it is gradually lowered from the upstream side toward the downstream side, specifically, for instance, such that it is 920° C. in the region in the vicinity of the substrate supply equipment 11 and it is 880° C. in the region in the vicinity of the substrate recovery equipment 15. In this case, each substrate proceeds in the solution flow passage 2 for 20 minutes. This means that the temperature of the flowing solution 4 in contact with the substrate is lowered at a temperature-descending speed of 2° C. per minute.

As a result, a silicon single crystal film is grown on the surface of each substrate which is contacted with the flowing solution 4 at a film-growing speed of 1.5 μm per minute. That is, it is possible to form a silicon single crystal film having a thickness of 30 μm on each substrate at a throughput of 690 substrate products having said silicon single crystal film every hour.

When the recovery crucible 3 is filled with the used solution (the melt), the recovery crucible 3 is replaced by an empty recovery crucible. The used solution contained in the recovery crucible 3 is heated to a temperature of 930° C., a powdery silicon in a prescribed amount is introduced into the heated solution in the recovery crucible, followed by being uniformly stirred, and the resultant solution is treated by increasing the temperature thereof by 10° C. By this, there is prepared a silicon-supersaturated solution in the crucible. This crucible having said silicon-supersaturated solution therein is subjected to replace the solution supply crucible 1 when it becomes to be empty.

As described in the above, the present invention has such significant advantages as will be described below.

There are realized a liquid-phase growth process and a liquid-phase growth apparatus having a markedly improved quantitative productivity. That is, it is possible to continuously and efficiently grow a desired crystal film on a plurality of substrates while effectively preventing unnecessary crystal growth on their back faces without using such a complicated jig as used in the prior art.

Particularly, said plurality of substrates are moved following the flow of the solution (the melt) for liquid-phase epitaxy. The solution flows in the solution flow passage, and the substrates are kept afloat on the surface of said flowing solution in the solution flow passage by one side of their surfaces. The plurality of substrates are prevented from being mutually overlapped, and the surfaces of the plurality of substrates which are in contact with said solution are contacted with the steady flow of said solution. This makes the crystal films grown on the surfaces of the plurality of substrates uniform in thickness. And a desired crystal-growing speed can be maintained also in the downstream region of the solution flow passage because the crystallizing material contained in the solution is not depleted. Further, even when an expensive metal solvent is used as the metal solvent of the solution for liquid-phase epitaxy, it can be repeatedly used. This diminishes the production cost of a product.

What is claimed is:

1. A liquid-phase growth process for continuously growing a crystal film on a plurality of substrates with respect to one side of their surfaces, comprising:

keeping said plurality of substrates afloat on the surface of a flowing solution for liquid-phase epitaxy which comprises a crystallizing material dissolved in a solvent in a supersaturated state and which is flowing in a solution flow passage; and while said plurality of substrates are being moved by virtue of said flowing solution in said solution flow passage, growing a crystal film on the surfaces of said plurality of substrates which are in contact with said flowing solution.

2. The liquid-phase growth process according to claim 1, wherein said plurality of substrates are arranged along said solution flow passage of said flowing solution, of said plurality of substrates thus arranged, one or more of them which are positioned in a downstream region of said solution flow passage are recovered, and the remaining substrates positioned upstream of said recovered substrates are moved toward a downstream direction of said solution flow passage by virtue of said flowing solution.

3. The liquid-phase growth process according to claim 1, including a step wherein said plurality of substrates are moved by virtue of said flowing solution and a step wherein said plurality of substrates are stopped and kept afloat on said flowing solution.

4. The liquid-phase growth process according to claim 1, wherein said flowing solution flows in said solution flow passage at a velocity which is faster than an average speed for said plurality of substrates to be moved.

5. The liquid-phase growth process according to claim 1, wherein a separation member is arranged between each adjacent two substrates of said plurality of substrates.

6. The liquid-phase growth process according to claim 1, wherein said flowing solution has a temperature gradient along said solution flow passage.

7. The liquid-phase growth process according to claim 1, wherein said flowing solution flows in said solution flow passage such that the velocity thereof is varied along said solution flow passage.

8. The liquid-phase growth process according to claim 1, wherein said flowing solution is recovered at an end portion of said solution flow passage of the flowing solution and a crystallizing material is dissolved in said recovered solution, and the recovered solution is recycled into said solution flow passage.

9. The liquid-phase growth process according to claim 1, wherein said solution flow passage has a grade which is gently sloped in a direction from the upstream side thereof toward the downstream side thereof so as to allow said flowing solution to flow in said solution flow passage at a desired flow speed.

10. The liquid-phase growth process according to claim 1, wherein said plurality of substrates have a density which is less than that of said flowing solution.

11. A liquid-phase growth apparatus for continuously growing a crystal film on a plurality of substrates with respect to one side of their surfaces, comprising:

a solution supply crucible for supplying a solution for liquid-phase epitaxy;

a solution flow passage for allowing said solution supplied from said solution supply crucible to flow therein; and a solution recovery crucible for recovering said solution from said solution flow passage, said solution supply crucible being communicated with said solution flow passage and said solution recovery crucible being communicated with said solution flow passage, wherein said solution flow passage has substrate supply means provided in the vicinity of said solution supply crucible and substrate recovery means provided in the vicinity of said solution recovery crucible, wherein said plurality of substrates are consecutively supplied in said solution flow passage by said substrate supply means, followed by being moved in said solution flow passage by virtue of said flowing solution in said solution flow passage while said plurality of substrates are kept afloat on the surface of said flowing solution, whereby a crystal film is grown on the surfaces of said plurality of substrates which are in contact with said flowing solution, and said plurality of substrates having said crystal film grown thereon are consecutively recovered by said substrate recovery means.

12. The liquid-phase growth apparatus according to claim 11, wherein said substrate supply means has a substrate cassette, an extrusion member and a slant portion, wherein said plurality of substrates are accommodated in said substrate cassette, and said plurality of substrates accommodated in said substrate cassette are extruded one by one by said extrusion member to enter said solution flow passage through said slant portion.

13. The liquid-phase growth apparatus according to claim 11, wherein said substrate recovery means has a substrate cassette, a recovery member and a slant portion, wherein said plurality of substrates having said crystal film grown thereon are extruded from said solution flow passage one by one onto said slant portion by said recovery member to enter in said substrate cassette.

14. The liquid-phase growth apparatus according to claim 11, wherein said solution flow passage has a grade which is gently sloped in a direction from the upstream side thereof toward the downstream side thereof so as to allow said flowing solution to flow in said solution flow passage at a desired flow speed.

* * * * *

UNITED STATES PATENT AND TRADEMARK OFFICE
CERTIFICATE OF CORRECTION

PATENT NO. : 7,048,797 B2
APPLICATION NO. : 10/665075
DATED : May 23, 2006
INVENTOR(S) : Masaki Mizutani et al.

It is certified that error appears in the above-identified patent and that said Letters Patent is hereby corrected as shown below:

COLUMN 1
Line 48, "as be" should read --as to be--.
Line 61, "make such" should read --make it such--.

COLUMN 2
Line 3, "to be" should be deleted.
Line 13, "to be" should be deleted.
Line 37, "being" should read --are being--.

COLUMN 4
Line 55, "portions" should read --portions.--.

COLUMN 6
Line 36, "being" should read --is being--.

COLUMN 9
Line 32, "230" should not be bold.

COLUMN 10
Line 12, "to be" should be deleted.

Signed and Sealed this

First Day of May, 2007

JON W. DUDAS
*Director of the United States Patent and Trademark Office*